US008252659B2

(12) United States Patent
Huyghebaert et al.

(10) Patent No.: US 8,252,659 B2
(45) Date of Patent: Aug. 28, 2012

(54) METHOD FOR PRODUCING INTERCONNECT STRUCTURES FOR INTEGRATED CIRCUITS

(75) Inventors: Cedric Huyghebaert, Leuven (BE); Jan Vaes, Leuven (BE); Jan Van Olmen, Boutersem (BE)

(73) Assignee: IMEC, Leuven (BE)

( * ) Notice: Subject to any disclaimer, the term of this patent is extended or adjusted under 35 U.S.C. 154(b) by 320 days.

(21) Appl. No.: 12/628,844

(22) Filed: Dec. 1, 2009

(65) Prior Publication Data
US 2010/0133660 A1    Jun. 3, 2010

Related U.S. Application Data

(60) Provisional application No. 61/119,267, filed on Dec. 2, 2008.

(51) Int. Cl.
*H01L 21/20* (2006.01)

(52) U.S. Cl. ........ 438/424; 438/636; 438/640; 438/786; 257/E21.038; 257/E21.252; 257/E21.269; 257/E21.576; 257/E23.144

(58) Field of Classification Search .................. 438/424, 438/633–640, 667, 786; 257/E21.029–E21.038, 257/252, 268, 269, 576, 579, 23.144, 145, 257/29.309
See application file for complete search history.

(56) References Cited

U.S. PATENT DOCUMENTS

| 6,245,669 | B1 * | 6/2001 | Fu et al. ........................ 438/636 |
| 6,255,211 | B1 | 7/2001 | Olsen et al. |
| 6,680,248 | B2 * | 1/2004 | Huang et al. ................... 438/638 |
| 6,838,352 | B1 * | 1/2005 | Zhao ............................. 438/386 |
| 6,998,216 | B2 * | 2/2006 | He et al. ........................ 430/296 |
| 7,122,900 | B2 * | 10/2006 | Takeda et al. ................. 257/758 |

(Continued)

FOREIGN PATENT DOCUMENTS
WO    WO 2009/102741 A1    8/2009

OTHER PUBLICATIONS

De Jaeger et al., "Optimisation of a Pre-Metal-Dielectric with a contact etch stop layer for 0.18 μm and 0.13 μm technologies", IEEE 2008.

*Primary Examiner* — Michael Lebentritt
(74) *Attorney, Agent, or Firm* — Knobbe Martens Olson & Bear LLP

(57) ABSTRACT

The present disclosure is related to method for producing a semiconductor device comprising the steps of: providing a semiconductor substrate (1), comprising active components on the surface of said substrate, depositing a top layer (2) of dielectric material on the surface of said substrate or on other dielectric layers present on said surface, etching at least one first opening (7) at least through said top layer, filling said opening(s) at least with a first conductive material (8), and performing a first CMP step, to form said first conductive structures (3,26), etching at least one second opening (13) at least through said top layer, filling said opening(s) at least with a second conductive material (10), and performing a second CMP step, to form said second conductive structures (4,24), wherein the method comprises the step of depositing a common CMP stopping layer (5,25) on said dielectric top layer, before the steps of etching and filling said first opening(s), so that said same CMP stopping layer is used for stopping the CMP process after filling of the first opening(s) as well as the CMP process after filling of the second opening(s). The disclosure is equally related to devices obtainable by the method of the disclosure.

9 Claims, 6 Drawing Sheets

U.S. PATENT DOCUMENTS

| | | | |
|---|---|---|---|
| 7,208,404 B2 * | 4/2007 | Tsao et al. | 438/618 |
| 7,462,535 B2 * | 12/2008 | Lee et al. | 438/250 |
| 7,482,687 B2 * | 1/2009 | Farrar | 257/712 |
| 7,553,760 B2 * | 6/2009 | Yang et al. | 438/637 |
| 7,648,882 B2 * | 1/2010 | Jiang et al. | 438/287 |
| 7,704,881 B2 * | 4/2010 | Klootwijk et al. | 438/667 |
| 7,951,704 B2 * | 5/2011 | Fang et al. | 438/622 |
| 7,968,460 B2 * | 6/2011 | Kirby et al. | 438/667 |
| 2002/0137337 A1 | 9/2002 | Lu et al. | |
| 2003/0211702 A1 * | 11/2003 | Parat et al. | 438/424 |
| 2006/0057836 A1 | 3/2006 | Nagarajan et al. | |
| 2008/0050919 A1 | 2/2008 | Van Aelst et al. | |
| 2008/0315418 A1 | 12/2008 | Boyd et al. | |

* cited by examiner

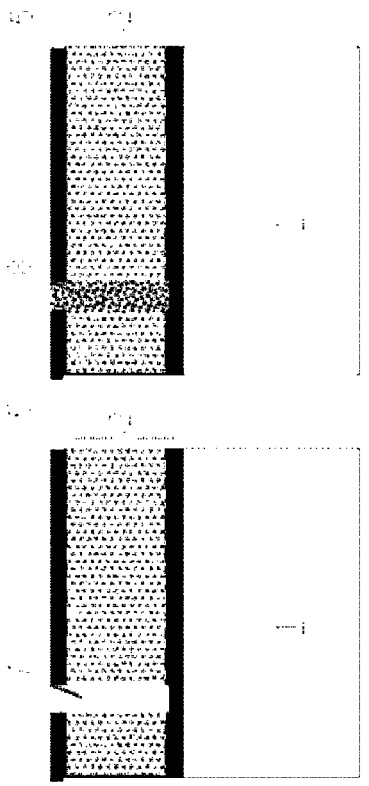 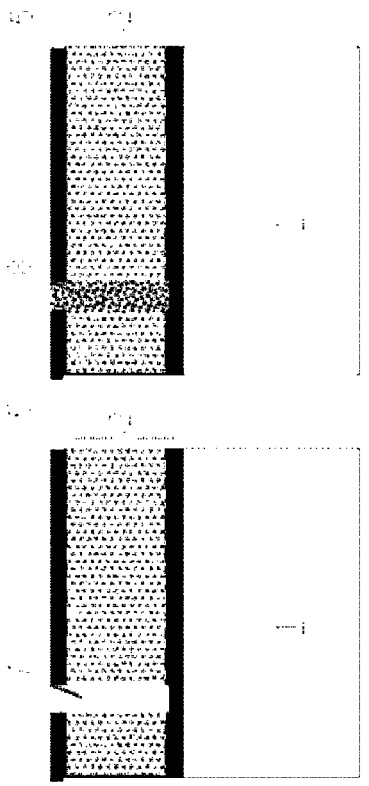 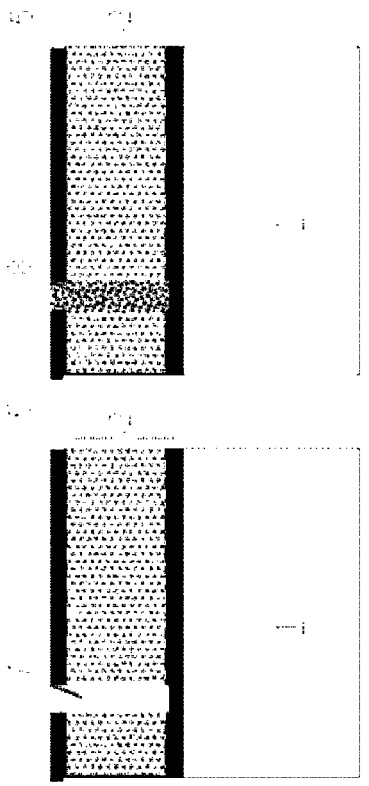 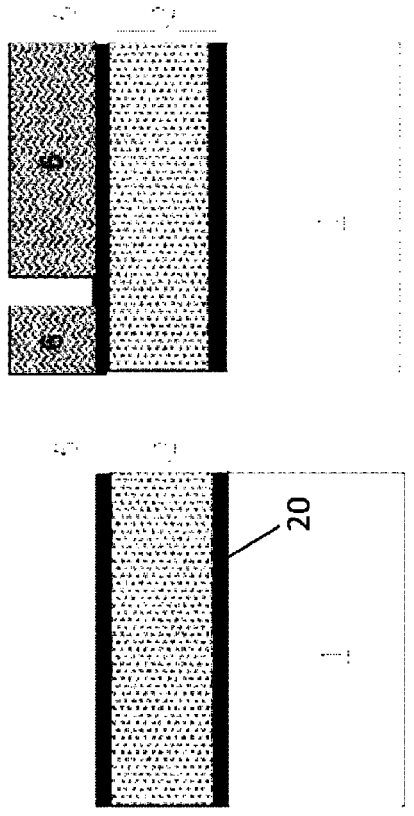
FIGURE 4A  FIGURE 4B  FIGURE 4C  FIGURE 4D
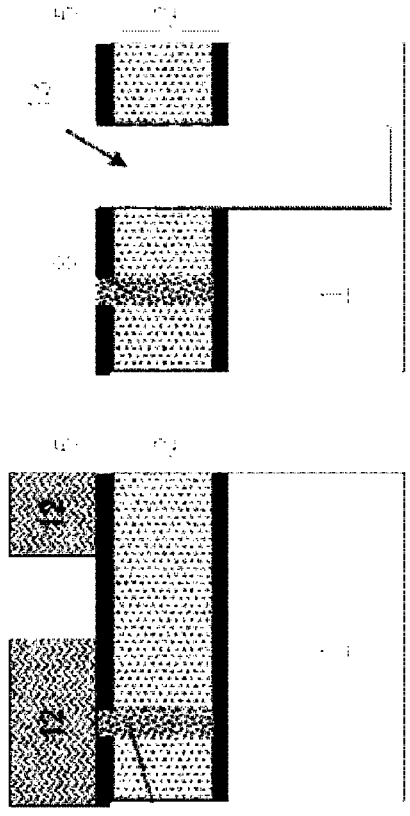 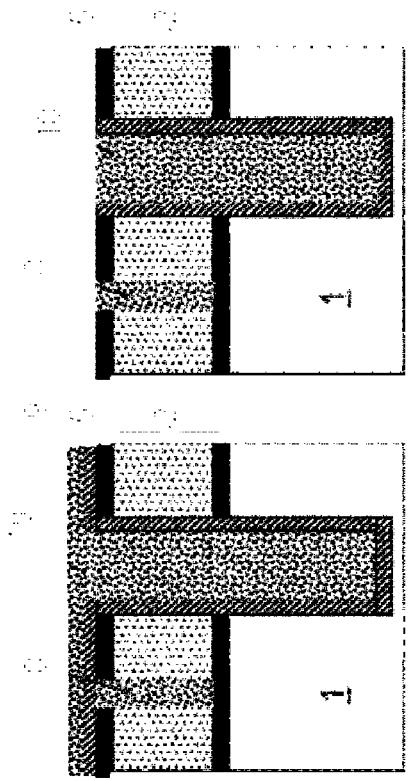 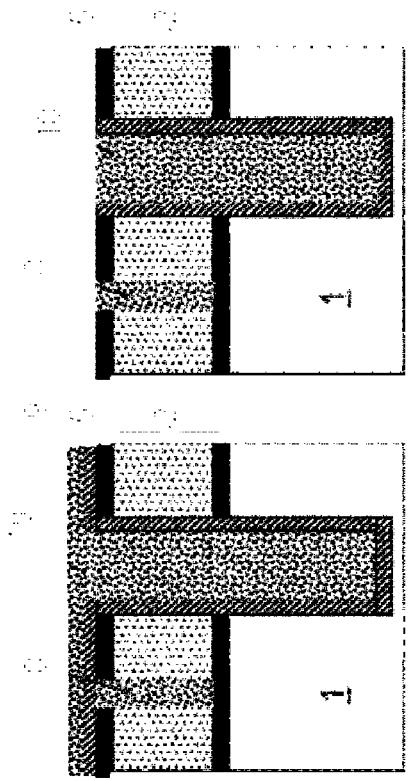 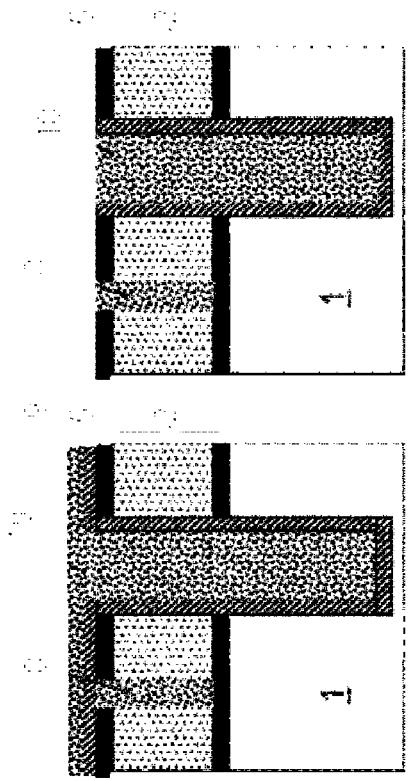
FIGURE 4E  FIGURE 4F  FIGURE 4G  FIGURE 4H

METHOD FOR PRODUCING INTERCONNECT STRUCTURES FOR INTEGRATED CIRCUITS

CROSS-REFERENCE TO RELATED APPLICATIONS

This application claims the benefit under 35 U.S.C. §119 (e) of U.S. provisional application Ser. No. 61/119,267, filed Dec. 2, 2008, the disclosure of which is hereby expressly incorporated by reference in its entirety and is hereby expressly made a portion of this application.

FIELD

The present disclosure is related to the integration of Through Silicon Vias (TSVs) for the stacking of Integrated Circuits (ICs).

BACKGROUND

The continuous pressure to reduce size, weight, and cost of semiconductor devices, while at the same time increasing the functionality thereof, has led to innovative, cost-effective 3D packaging concepts. Among 3D packaging techniques, through-silicon-via (TSV) electrodes are able to provide the shortest and most beneficial vertical connections. To realize TSV, essentially vertical connections are etched through the silicon wafer and filled with conductive material. These vias allow multiple chips to be stacked together, allowing greater amounts of information to be passed between the chips.

Connection lengths can be as short as the thickness of a chip and hence high density, high aspect ratio connections are possible. TSV interconnections also help to reduce the RC delays and power consumption by physically reducing the length of interconnects between the functional units/blocks on a chip. The technologies engaged with TSV chip connection include TSV etching, insulator/barrier/seed deposition, via filling, surface copper removal, wafer thinning, bonding/stacking, inspection, test, etc.

One of the issues to be solved in damascene-like TSV integration processes is the selective removal of overburden of conductive material (e.g. Cu) and barrier material (e.g. a Ta or Ti comprising layer) after completing the filling of the TSV, by applying Chemical Mechanical Polishing techniques (CMP). The control over the CMP process is extremely important: all the conductive material and barrier material has to be removed from the surface in order to prevent shortcuts in the final device. On the other hand, not too much surface (e.g. $SiO_2$) material should be consumed in the removal step in order to prevent a too strong attack of the underlying structures (e.g. contact plugs) that will allow the TSV to be connected to the conventional interconnects. Due to the small difference in material selectivity of the CMP process for the barrier material (e.g. TaN or TiN) versus the surface material (e.g. $SiO_2$) the CMP removal process has an extremely narrow process window. A very thick barrier layer has to be deposited in order to ensure a continuous coverage of the barrier layer all over the surface and the polishing slurries are not selective enough towards the underlying (oxide) surface layer. A slight over-polish, which is a standard procedure to deal with non-uniformities with CMP, will strongly affect the surface underneath. A loss of several tenths of percent of the total thickness can be expected. This would result in distorted electrical performance or completely destroyed device operation.

The problem to be solved is thus to remove the overburden of barrier and conductive material after filling of a Through Silicon Via (TSV) using chemical mechanical polishing (CMP) thereby creating a larger process window to compensate for non-uniformity in deposition and polishing such that a 10-20% "over" polish can be allowed without thereby damaging the dielectric stack (in other words without affecting other integration steps).

The process control of the CMP step to remove the overburden of barrier, seed and conductive material after filling of a Through Silicon Via (TSV) is extremely important since all the barrier, seed and conductive material has to be removed from the surface in order to prevent shortcuts in the final device. On the other hand not too much dielectric underneath (oxide) should be consumed in order to prevent a too strong attack of the vias (being contact plugs or vias at any metal layer below) that will allow the TSV to be connected to the conventional interconnects.

As stated, the process window for the CMP step is extremely narrow because a rather thick overburden of barrier material has to be deposited in order to ensure an continuous barrier deposition all over the Via surface (sidewalls) and the slurries are often not selective enough towards the underlying dielectric layer (oxide). The thickness of the barrier layer on the surface is a consequence of (a result of) the poor conformality of state of the art Plasma Vapor Deposition (PVD) layers which may be not higher than 10% because of the low deposition efficiency onto the sidewalls of high aspect ratio vias (typically very low efficiency is achieved at the lower part of the sidewalls) A slight over-polish, which is a standard procedure to deal with non-uniformities with CMP, will strongly affect the PMD (Pre Metal Deposited) or IMD (Inter metal deposited) dielectric layer (oxides).

Through Silicon Vias may be integrated during Front End Of Line processing. In this case the TSV is etched through the Pre-Metal Dielectric (PMD) stack deposited on a semiconductor wafer (in most cases a silicon wafer), said wafer comprising active components (i.e. transistors etc) of an Integrated Circuit (IC), and through the silicon wafer itself, in order to contact an underlying IC. A TSV may also be integrated at a later stage of the processing during Back End Of Line processing, where several levels of Inter Metal Dielectric stacks (IMD) are deposited on a silicon wafer, each level comprising contact vias and trenches filled with metal for forming interconnects. The TSV is then etched through the several IMD levels and through the underlying silicon substrate, again in order to contact an underlying IC.

A solution to the problem of the insufficient window for CMP which might have been proposed on the basis of general knowledge of CMP would be to introduce the CMP stopping layer prior to the start of TSV processing (typically just before patterning the TSV). Nevertheless, the introduction of the CMP stopping layer in this module results in a number of additional integration problems in the following IMD module. Indeed this additional stopping layer needs to be etched in order to contact vias (to contact device or metal-1) while at the same time the Cu of the TSV is fully exposed. This is typically done in a dry etch step. The exposed Cu is contaminating the etch chamber, which results in a drift of the etch-process as a function of the etch-time and number of etched wafers. Another unwanted effect is the corrosion of the Cu surface of the TSV during exposure in the etch chamber, which results in a higher (unwanted) resistivity. FIG. 1 illustrates the above described problem in a final device having at least one Through Substrate Via (TSV) 4 fabricated according to the method suggested above, wherein a PMD stack is provided on top of a substrate 1. A contact via 3 is produced and filled, prior to the production of a TSV 4. A CMP stop layer 5' is deposited prior to the etching of the TSV. The problem indicated is the fact that the CMP stopping layer 5' still needs to be opened (above the contact via 3) while Cu is exposed in Through Substrate Vias (TSV).

FIG. 2 illustrates a typical problem in a final device having at least one Through Silicon Vias (TSV) fabricated according to the state of the art method. Resist footing occurs (see arrow) in the resist 30 after patterning of the opening to determine the contact via 3. Presently this problem is solved by applying a thin oxide layer on the PMD stack.

SUMMARY

The disclosure is related to a method and devices as disclosed in the appended claims. The disclosure is thus related to a method for producing a semiconductor device comprising one or more layers of mainly dielectric material, with at least one of a first type of conductive structure and at least one of a second type of conductive structure embedded in one or more of said dielectric layer(s), and possibly in said substrate, comprising the steps of:

Providing a semiconductor substrate, comprising active components on the surface of said substrate, Depositing a top layer of dielectric material on the surface of said substrate or on other dielectric layers present on said surface, Etching at least one first opening at least through said top layer, filling said first opening(s) at least with a first conductive material, and performing a first Chemical Mechanical Polishing (CMP) step, to form said first conductive structures, Etching at least one second opening at least through said top layer, filling said second opening(s) at least with a second conductive material, and performing a second CMP step, to form said second conductive structures, wherein the method comprises the step of depositing a common CMP stopping layer on said dielectric top layer, before the steps of etching and filling said first opening(s), so that said common CMP stopping layer is used for stopping the CMP process after filling of said first opening(s) as well as the CMP process after filling of said second opening(s).

According to one embodiment, said top layer of dielectric material is a Pre-metal Dielectric stack deposited on the surface of said substrate and wherein said at least one first opening to be filled with a first conductive material is a contact via for contacting the active structures in the level below and said at least one second opening to be filled with a second conductive material is a Through Substrate Via for connecting a sub-laying IC.

According to another embodiment, said top layer of dielectric material is an intermetallic dielectric layer deposited on a PMD stack or on other IMD-layers present on the substrate, wherein said at least one first opening to be filled with a first conductive material is an interconnect via for contacting the interconnect layer underneath and said at least one second opening to be filled with a second conductive material is a Through Substrate Via for connecting a sub-laying IC.

The disclosure is particularly related to a method for producing a semiconductor device, comprising the steps of:

First providing a substrate, said substrate comprising active components of a semiconductor device and a Pre metal dielectric stack of layers (PMD), Depositing a CMP stopping layer, Depositing photosensitive layers and patterning openings in said photosensitive layers to define contact vias in the Pre metal dielectric (PMD) stack, Etching the contact vias in the PMD stack within the patterned openings in the PMD and then stripping the remaining photosensitive material, Depositing a dielectric and barrier material onto the sidewalls of the contact vias and subsequently filling the contact vias with and a first conductive material, Removing the overburden of barrier material and first conductive material using chemical mechanical polishing (CMP) selectively to the CMP stopping layer, Depositing photosensitive layers and patterning openings in said photosensitive layers to define Through Substrate Vias (TSV), Etching Through Substrate Vias (TSV) in the PMD stack and partly in the substrate underneath and then stripping the remaining photosensitive material, Depositing a dielectric and barrier material and optionally a seedlayer material onto the sidewalls of the Through Substrate Vias (TSV) and subsequently filling the TSV with and a second conductive material, Removing the overburden of barrier material and second conductive material using chemical mechanical polishing (CMP) making use of the CMP stopping layer.

The disclosure is also related to a method for producing a semiconductor device comprising the steps of:

First providing a substrate, said substrate comprising an at least partly completed Back End Of Line (BEOL) stack comprising n-1 levels of vias and trenches embedded in an Inter Metal dielectric (IMD), then Depositing an IMD layer to form level n of the BEOL stack, Depositing a CMP stopping layer on top of the deposited IMD layer of level n, then Depositing photosensitive layers on top of the CMP stopping layer and patterning openings in said photosensitive layers to define trenches and/or vias within the deposited IMD layer of level n, then Etching the trenches and/or vias within the patterned openings in the deposited IMD layer of level n and then stripping the remaining photosensitive material, then Depositing a dielectric, barrier and/or seed material onto the sidewalls of the trenches and/or vias subsequently filling said trenches and/or vias with a first conductive material, then Removing the overburden of dielectric, barrier and optionally a seed material and first conductive material using chemical mechanical polishing (CMP) making use of the CMP stopping layer, then Depositing photosensitive layers and patterning openings in said photosensitive layers to define Through Substrate Vias (TSV), then Etching Through Substrate Vias (TSV) in the deposited IMD layer of level n and further extending into the substrate underneath and subsequently stripping the remaining photosensitive material, then Depositing a dielectric, barrier and optionally a seed material onto the sidewalls of the Through Substrate Vias (TSV) and subsequently filling the TSV with a second conductive material, Removing the overburden of dielectric, barrier and optionally a seed material and second conductive material using chemical mechanical polishing (CMP) making use of the CMP stopping layer.

In the method of the disclosure, the CMP stopping layer may be selected from a silicon carbon (SiC) layer, a silicon nitride (SiN) layer, an oxycarbide (SiOC) layer, a silicon oxynitride (SiON) layer and wherein said layer is deposited using chemical vapor deposition (CVD).

The disclosure is also related to a semiconductor device, comprising:
- A semiconductor substrate, preferably a silicon substrate,
- A PMD stack with a CMP stopping layer on top of said PMD stack deposited on said substrate, and
- At least one Through Substrate Via (TSV) obtainable by etching through the CMP stopping layer, the PMD stack and partly in the substrate such that said TSV is embedded in the CMP stopping layer and the PMD stack and partly in the substrate, and
- At least one contact via obtainable by etching through the CMP stopping layer and the PMD stack such that said contact via is embedded in the CMP stopping layer and the PMD stack.

The disclosure is also related to a semiconductor device, comprising:
- An at least partly completed Back End Of Line (BEOL) stack comprising n-1 metal levels of vias and trenches embedded in an Inter Metal dielectric (IMD) stack with a CMP stopping layer on top of said IMD stack deposited on said substrate, and
- At least one Through Substrate Via (TSV) obtainable by etching through the CMP stopping layer, the IMD stack and partly in the substrate such that said TSV is embedded in the CMP stopping layer and the IMD stack and partly in the substrate, and
- An $n^{th}$ metal level via obtainable by etching through the CMP stopping layer and the IMD stack such that said $n^{th}$ metal level via is embedded in the CMP stopping layer and the IMD stack.

BRIEF DESCRIPTION OF THE DRAWINGS

All figures are intended to illustrate some aspects and preferred embodiments. The figures are depicted in a simplified way for reason of clarity. Not all alternatives and options are shown and therefore the disclosure is not limited to the content of the given drawings. Like numerals are employed to reference like parts in the different figures.

FIGS. 4A-H illustrate the process flow to define TSVs in a substrate after creation of the contact vias (plugs) according to a preferred embodiment of the disclosure.

DETAILED DESCRIPTION OF THE PREFERRED EMBODIMENTS

Figure 1:
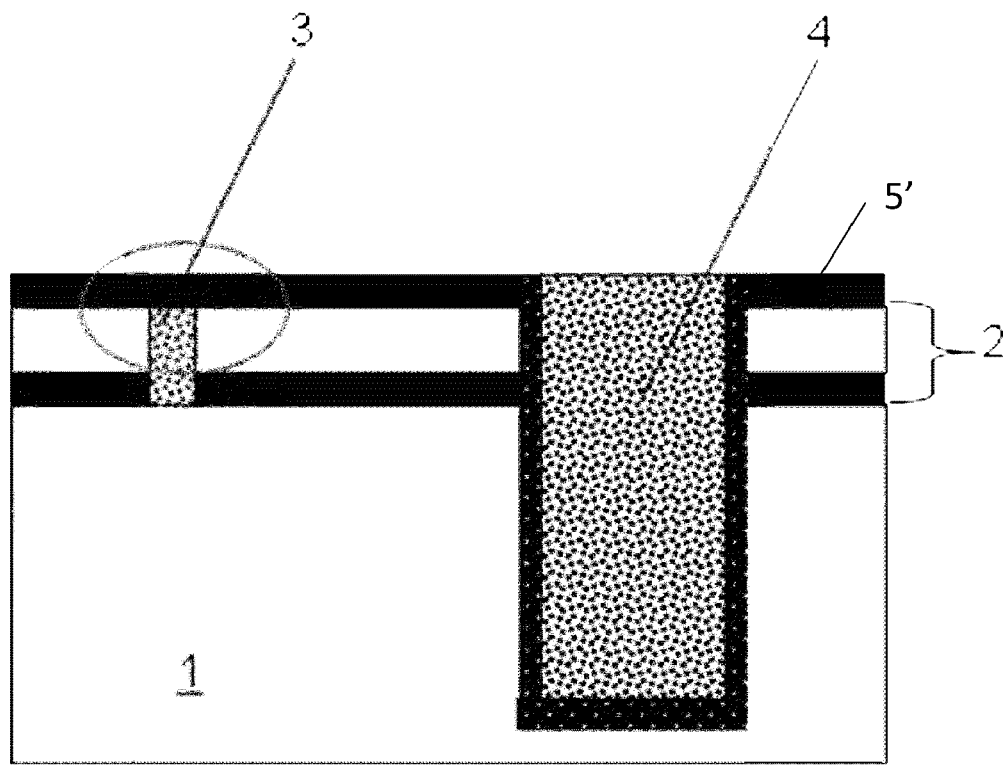
FIG. 1 illustrates a problem in a final device having at least one Through Substrate Via (TSV) fabricated according to a method wherein a CMP stop layer is applied prior to TSV formation but after contact via formation. The problem indicated is the fact that the CMP stopping layer still needs to be opened while Cu is exposed in TSVs.
Figure 2:
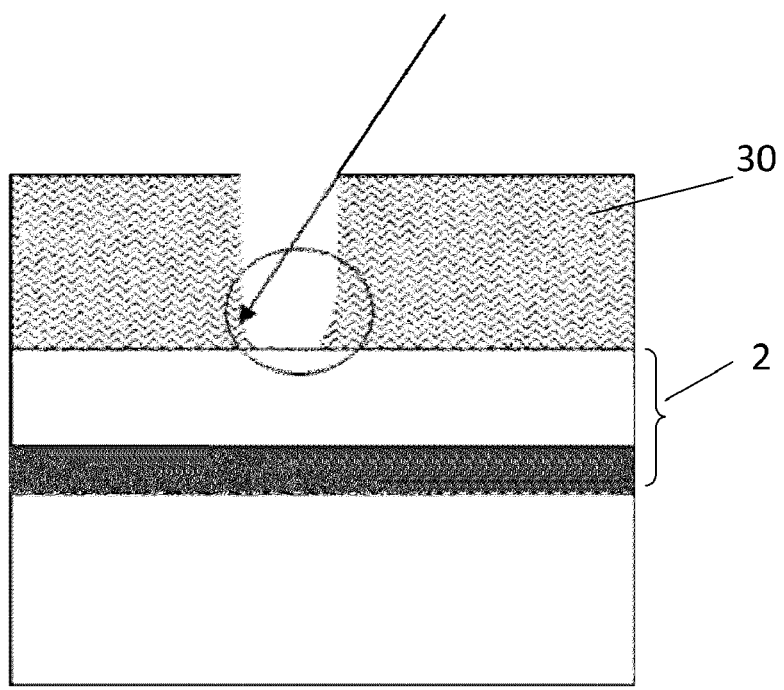
FIG. 2 illustrates one of the problems in a final device having at least one TSV fabricated according to the state of the art method.

It is an object of the disclosure to provide a method for removing the overburden of dielectric liner, barrier, seed and conductive material after filling a Through Substrate Via (TSV) using chemical mechanical polishing (CMP) thereby avoiding the problem of a too narrow selectivity difference which results in an extremely narrow process window for the CMP. In the present description of the disclosure, the abbreviation 'TSV' stands for 'Through Substrate Via', wherein the substrate may be a silicon substrate. In the latter case, TSV has the meaning 'Through Silicon Via', by which it is generally known in the art. Said conductive filling material is preferably a metal such as Cu which is preferably incorporated into the TSV using electrochemical deposition (ECD) also referred to as electrochemical plating (ECP, or plating). The overburden further comprises a dielectric liner, barrier material and optionally a seed material which is deposited onto the inner sidewalls in the TSV before filling the TSV with a conductive material. Said dielectric liner is used as isolator in between the conductive filing and the dielectric stack and is preferably selected from and oxide layer such as TEOS (Tetraethyl orthosilicate) and may be deposited using SA-CVD. Said barrier material is preferably selected from a Ta layer (e.g. TaN), Ti layer (e.g. a Ti/TiN layer). Said seedlayer is preferably comprising Cu and may be deposited using Physical Vapor Deposition (PVD). Said seed layer is preferably used when electrochemical deposition (ECD) is used to fill the TSV with copper.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Moreover, the term top and the like in the description and the claims are used for descriptive purposes and not necessarily for describing relative positions. It is to be understood that the terms so used are interchangeable under appropriate circumstances and that the preferred embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary preferred embodiments, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that preferred embodiments may be practiced without these specific details. In other instances, well-known methods, structures and techniques have not been shown in detail in order not to obscure an understanding of this description.

The disclosure will now be described by a detailed description of several preferred embodiments. It is clear that other preferred embodiments can be configured according to the knowledge of persons skilled in the art without departing from the true spirit or technical teaching of the disclosure as defined by the appended claims.

According to the disclosure, two different metal containing structures (e.g. a contact via and a TSV) are integrated at the same planar level using a damascene type process which involves the need of 2 planarization (CMP) steps after filling the holes (vias) with the respective suitable metal. The idea is to use only 1 CMP stop layer for the 2 CMP steps whereby said "common" stop layer is integrated before the patterning of the (at least one) first opening to be filled with the first metal. The structures are embedded in one or more dielectric layers (e.g. contact vias in an IMD layer between different metallisation levels) and possibly in the substrate itself (TSV). The common CMP layer is deposited on a top dielectric layer in which the two different structures are to be produced.

According to a first preferred embodiment, the top dielectric layer is a PMD stack (FEOL embodiment, see further). According to a second embodiment, the top dielectric layer is an IMD layer (BEOL embodiment, see further). A CMP stopping layer is deposited onto the PMD or IMD oxide stack before the introduction of contacting vias or holes in said PMD or IMD stack, for contacting the preceding level (i.e. the active components on the substrate in the case of the PMD, or the preceding metal layer in the case of the IMD).

Figure 3A:
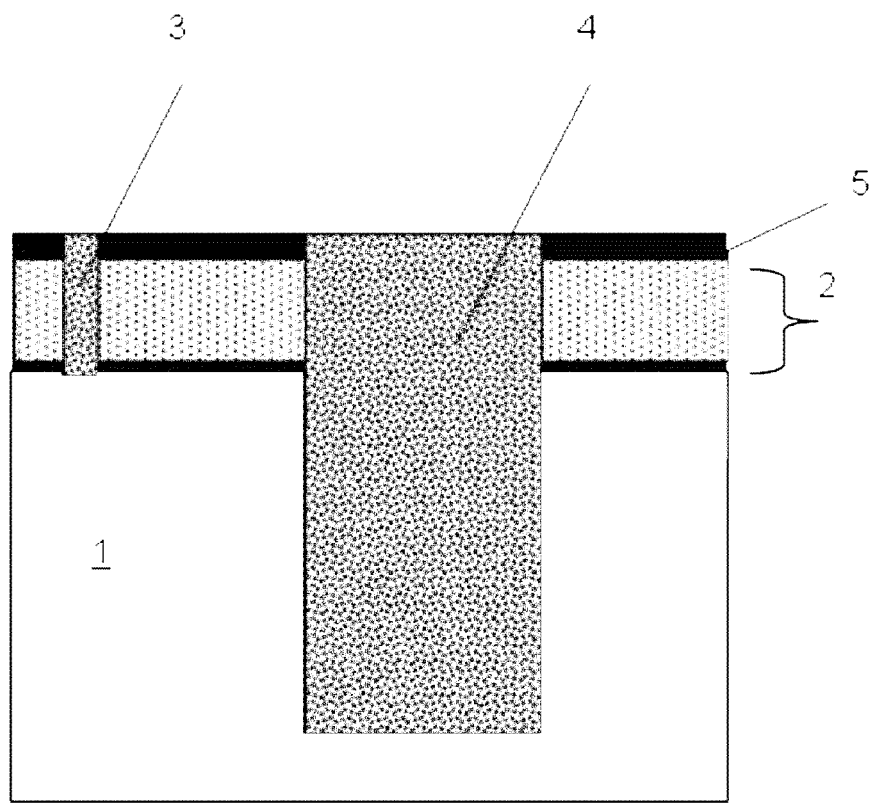
FIG. 3A illustrates a final device having at least one TSV fabricated in the FEOL stage according to preferred embodiments of the disclosure.

Otherwise said: according to a first embodiment, said two metals and related openings are a first opening to be filled with a metal wherein said first opening is a contact via to contact the active structures in the level below and a second opening to be filled with a metal wherein said second opening is a TSV connecting the sub-laying IC. This is referred to as the 'FEOL embodiment'. A device produced according to this embodiment is shown in FIG. 3A.

Figure 3B:
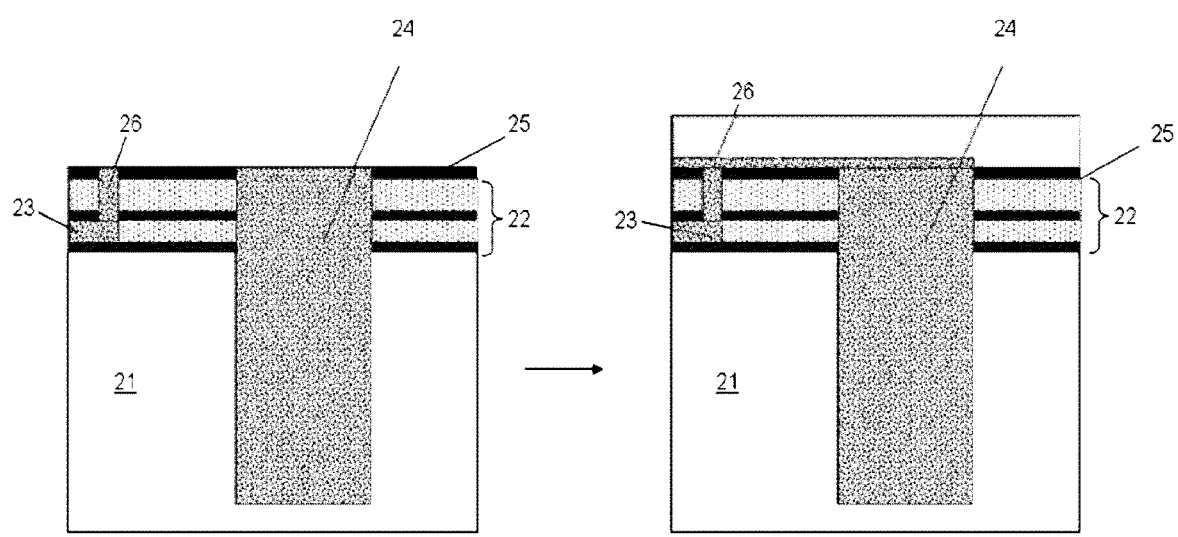
FIG. 3B illustrates a final device having at least one TSV fabricated in the BEOL stage according to preferred embodiments of the disclosure.

According to a second embodiment, said two metals and related openings are a first opening to be filled with a metal wherein said first opening is an interconnect via to contact the interconnect metal layer underneath and a second opening to be filled with a metal wherein said second opening is a TSV connecting the sub-laying IC. This is referred to as the 'BEOL embodiment'. A device produced according to this embodiment is shown in FIG. 3B.

Figure 6:
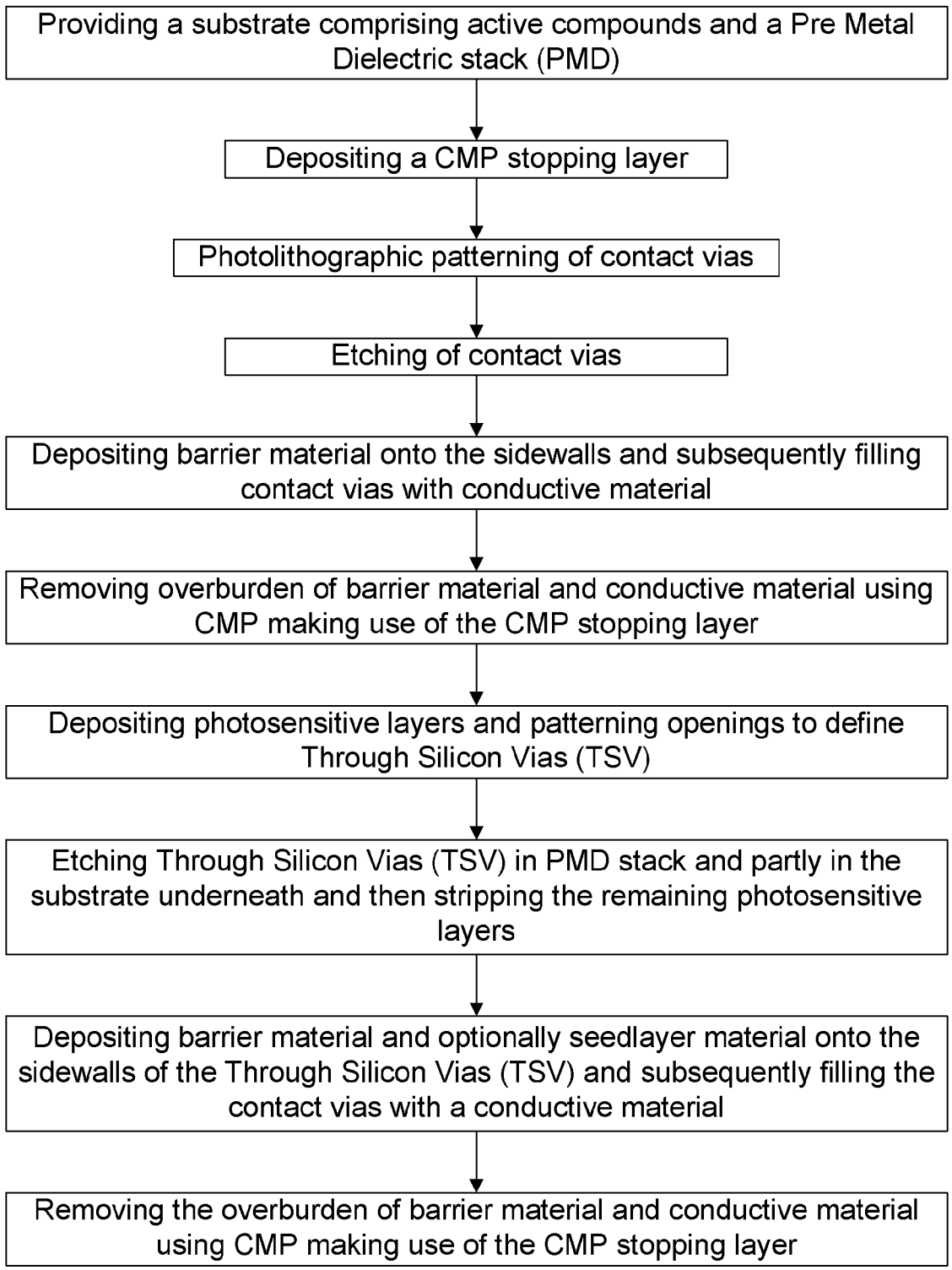
FIG. 6 illustrates a flow chart illustrating the process flow according to preferred embodiments of the disclosure.

FIG. 4 illustrates a preferred process flow according to the FEOL embodiment of the method and FIG. 6 illustrates a flow chart illustrating said process flow.

According to the FEOL-embodiment, a method is provided for removing the overburden of barrier, seed and filling material after filling a Through Substrate Via (TSV), said method comprises at least the steps of:

First providing a substrate 1, preferably a silicon substrate, said substrate comprising active components of a semiconductor device and a Pre metal dielectric stack of layers (PMD) 2, Depositing a CMP stopping layer 5, Depositing first photosensitive layers 6 and patterning openings in said photosensitive layers to define contact vias in the Pre metal dielectric (PMD) stack 2, Etching the contact vias 7 in the PMD stack 2 within the patterned openings in the PMD and then stripping the remaining photosensitive material (photoresist), Depositing a dielectric and barrier material (not shown) onto the sidewalls of the contact vias and subsequently filling the contact vias with a conductive material 8, Removing the overburden of barrier material and conductive material using chemical mechanical polishing (CMP) making use of the CMP stopping layer 5, Depositing second photosensitive layers 12 and patterning openings in said photosensitive layers to define Through Substrate Vias (TSV), Etching Through Substrate Vias (TSV) 13 in the PMD stack 2 and partly in the substrate 1 underneath and then stripping the remaining photosensitive material (photoresist), Depositing a dielectric and barrier material 9 and optionally a seedlayer material onto the sidewalls of the Through Substrate Vias (TSV) 13 and subsequently filling the TSV with a conductive material 10, Removing the overburden of barrier material 9 and conductive material 10 using chemical mechanical polishing (CMP) making use of the CMP stopping layer 5.

Figure 5:
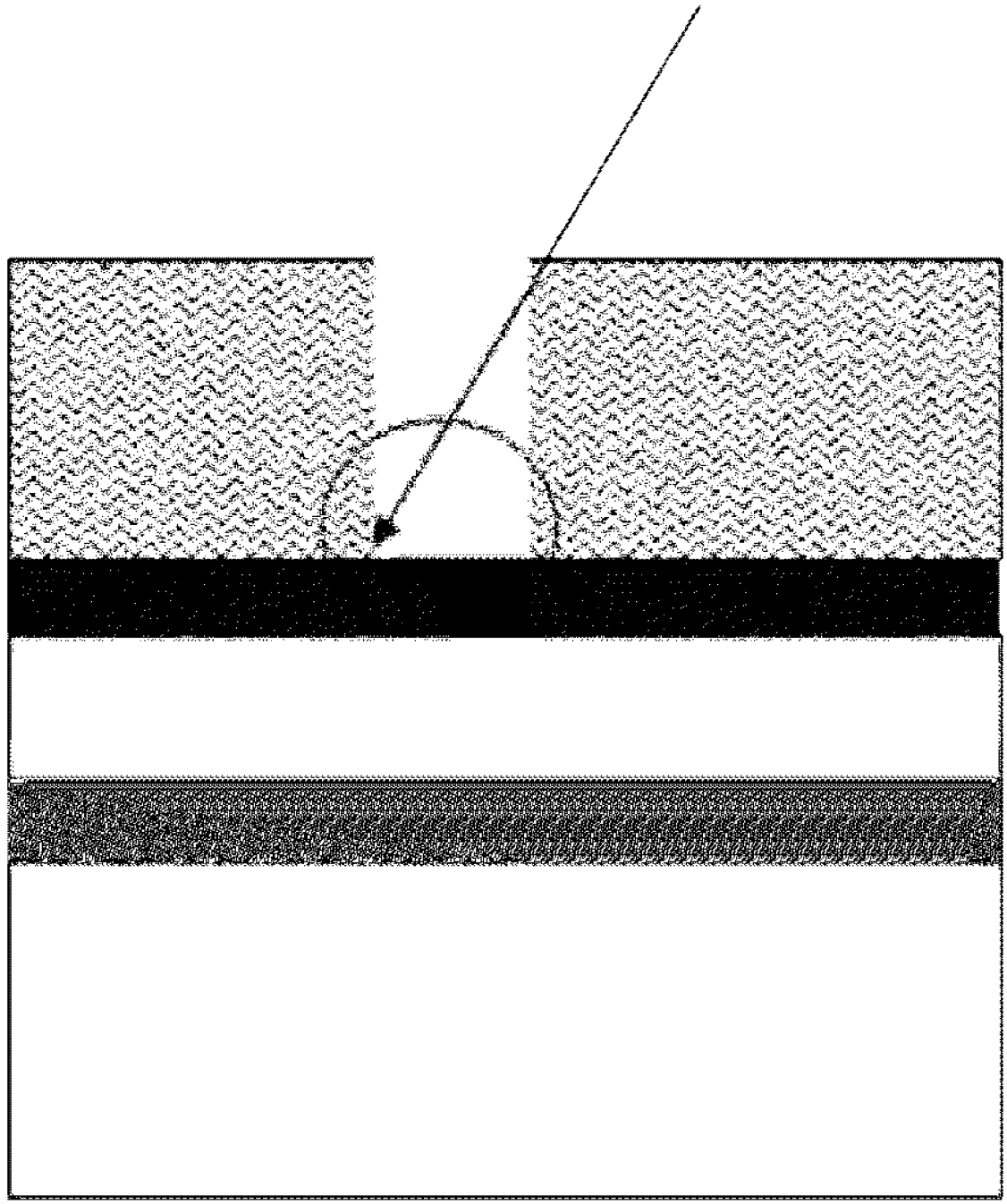
FIG. 5 illustrates how the disclosure solves the problem illustrated in FIG. 2.

The method is thus equally a method for producing a semiconductor device comprising the above steps. FIG. 5 illustrates how the problem of resist footing occurring in the resist after patterning of the opening to determine the contact via is avoided by the method of the disclosure. The resist footing is avoided by the presence of the CMP layer 5. The CMP layer thus fulfills the same role as the thin oxide layer deposited for this purpose.

According to preferred embodiments, the Pre metal dielectric stack of layers (PMD) is such that it gives electrical isolation (from the metal interconnects) and physical isolation (to avoid contamination e.g. from mobile ions) in addition to many other requirements. The PMD stack has preferably a thickness in the range of 300-400 nm, more preferably around 350 nm. For 0.18 μm and 0.13 μm technologies, the PMD must also allow a contact etch process with a superior selectivity towards the underlying silicide mainly because thickness of the silicides are continuously scaling down while the difference in aspect ratio between deep contacts and shallow contacts remains considerable. Examples of suitable PMD stacks are described by B. De Jaeger et al (B. De Jaeger et al., "Optimisation of a Pre-Metal-Dielectric with a contact etch stop layer for 0.18 μm and 0.13 μm technologies", IEEE 2008) and comprise at least a bulk layer of dielectric material with an etch stop layer underneath the bulk layer. A PMD stack may comprise for example a bulk layer of High Density Plasma Phosphorous-doped Silicon Glass (HDP PSG) with an etch stop layer 20 underneath (see FIG. 4), e.g. a 100 nm LP-CVD TEOS layer or a PE-CVD SiON, SiC, . . . layer is deposited before the deposition of the bulk HDP PSG layer. The etch stop layer (liner) 20 is also needed because it prevents phosphorous diffusion from the PSG layer towards the active components in the substrate.

According to preferred embodiments, a polishing step is introduced after depositing the PMD stack (bulk HDP PSG layer) to planarize the PMD stack.

According to preferred embodiments, the (polishing) CMP stopping layer 5 is selected from silicon carbon (SiC), silicon nitride (SiN), oxycarbide (SiOC), silicon oxynitride (SiON) and said layer is deposited using chemical vapor deposition (CVD). The thickness of said layer is in the range of 30 nm up to 100 nm, more preferably around 50 nm. Said polishing stop layer may also act as an etching hard mask during the subsequent contact hole etching.

According to preferred embodiments, the step of etching the contact vias in the PMD stack is performed using reactive ion etching.

According to preferred embodiments the step of depositing a barrier material onto the sidewalls of contact vias is preferably performed by depositing a titanium-titanium nitride (Ti/TiN) layer using Physical Vapor Deposition (PVD), Atomic Layer Deposition (ALD) or Chemical Vapor Deposition (CVD). The thickness of the TiN layer is approximately 10 nm up to 20 nm.

According to preferred embodiments the step of filling the contact vias with a conductive material is preferably performed by depositing a suitable metal e.g. tungsten (W) by using chemical vapor deposition (e.g. Metal Organic CVD (MO-CVD)). The reaction material for forming the tungsten layer includes $WF_6$ and $SiH_4$, the TiN barrier layer will prevent the fluorine from penetrating into the PMD stack. In a preferred embodiment, the temperature of the CVD deposition ranges from 300° C. to 500° C.

According to preferred embodiments the steps of providing a PMD stack, patterning contact holes up to the filling of the contact holes with tungsten and removing (polishing) the overburden are referred to as the "PMD module".

According to preferred embodiments the steps of patterning and etching TSVs up to depositing a barrier material, a seedlayer material onto the sidewalls of the TSVs and subsequently filling the contact vias with and a conductive material up to the step of removing the overburden of barrier material and conductive material using CMP making use of the CMP are referred to as the "TSV module".

According to preferred embodiments the step of depositing photosensitive layers and patterning openings in said photosensitive layers to define TSVs is performed using state of the art lithographic patterning. The etching of TSV through the PMD stack and partly through the substrate underneath using the patterned openings in the photosensitive layers is performed using state of the art reactive ion etching (e.g. as described in US Patent Publ. No. 2008/0050919). Typical dimensions of TSV are 2-5 μm diameter and 10-50 μm deep.

According to preferred embodiments the step of depositing a barrier material and optionally a seedlayer material onto the sidewalls of the TSV is performed by typically depositing an CVD oxide liner first onto which a Ta barrier is deposited and subsequently a Cu seed layer.

According to preferred embodiments the step of filling the TSV with a conductive material is performed by filling the TSV with copper using copper electrochemical deposition (ECD, also referred to as "plating").

Figure 7:
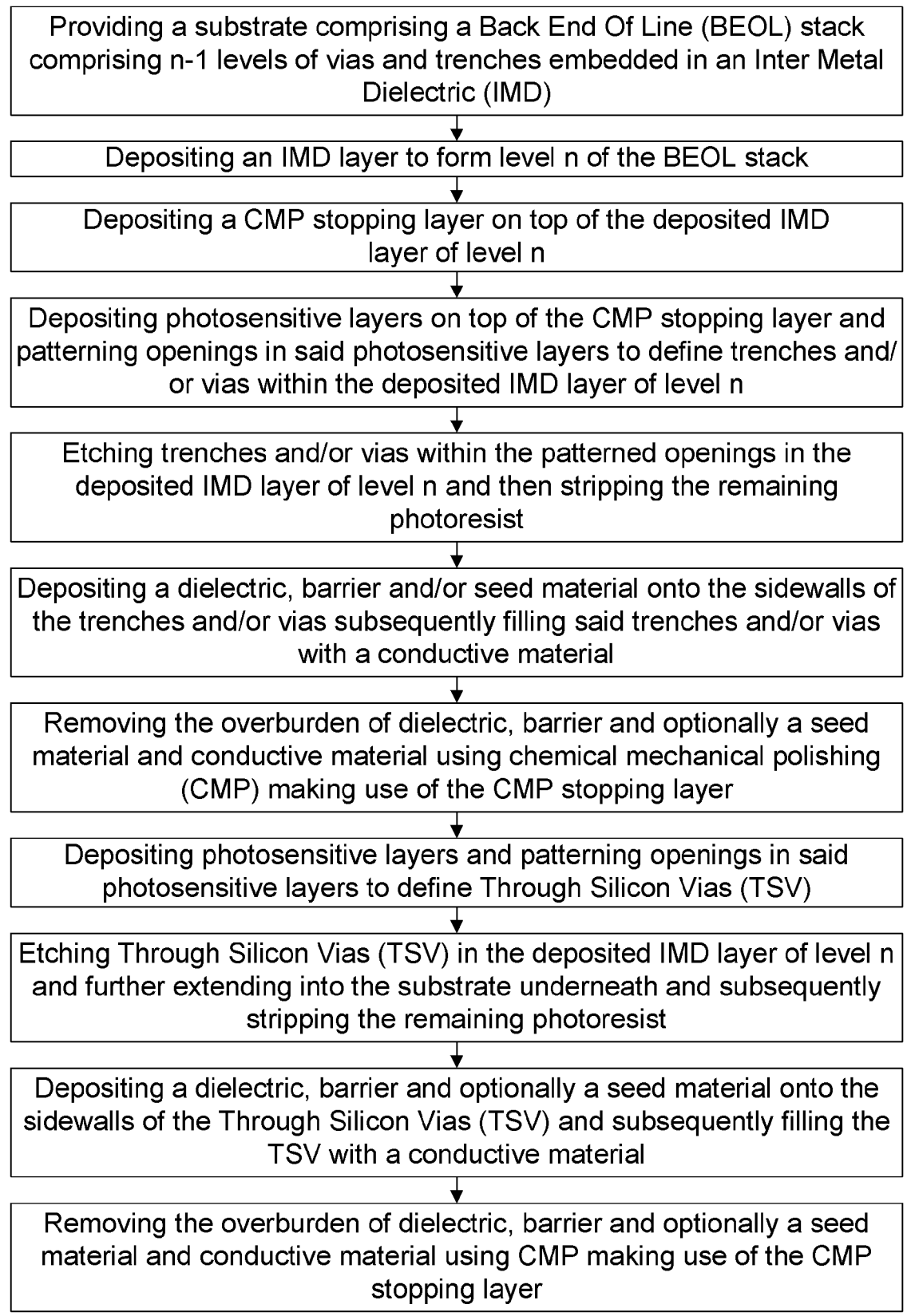
FIG. 7 illustrates an alternative flow chart illustrating the process flow according to preferred embodiments of the disclosure.

According to the BEOL embodiment, the substrate comprises a Back End Of Line (BEOL) stack comprising different levels of vias and trenches embedded in an Inter Metal dielectric (IMD). A method is provided to integrate a TSV after (at least partly) completing the BEOL stack wherein said method is capable of removing the overburden of barrier, seed and filling material after filling the TSV without affecting the integration (e.g. without affecting the layers underneath, without damaging the features underneath, . . . ). The resulting device is illustrated in FIG. 3B and the process flow is illustrated in FIG. 7. According to the BEOL embodiment, the method for removing the overburden of dielectric, barrier, seed and filling material after filling a TSV comprises at least the steps of:

First providing a substrate, preferably a silicon substrate, said substrate comprising an at least partly completed Back End Of Line (BEOL) stack comprising n-1 levels of vias and trenches embedded in an Inter Metal dielectric (IMD) layer, then Depositing an IMD layer to form level n of the BEOL stack, Depositing a CMP stopping layer on top of the deposited IMD layer of level n, then Depositing photosensitive layers on top of the CMP stopping layer and patterning openings in said photosensitive layers to define trenches and/or vias within the deposited IMD layer of level n, then Etching the trenches and/or vias within the patterned openings in the deposited IMD layer of level n and then stripping the remaining photosensitive material (photoresist), then Depositing a dielectric, barrier and/or seed material onto the sidewalls of the trenches and/or vias subsequently filling said trenches and/or vias with a conductive material, then Removing the overburden of dielectric, barrier and optionally a seed material and conductive material using chemical mechanical polishing (CMP) making use of said CMP stopping layer, then Depositing photosensitive layers and patterning openings in said photosensitive layers to define Through Substrate Vias (TSV), then Etching Through Substrate Vias (TSV) in the deposited IMD layer of level n and further extending into the substrate underneath and subsequently stripping the remaining photosensitive material (photoresist), then Depositing a dielectric, barrier and optionally a seed material onto the sidewalls of the Through Substrate Vias (TSV) and subsequently filling the TSV with a conductive material, Removing the overburden of dielectric, barrier and optionally a seed material and conductive material using chemical mechanical polishing (CMP) making use of said CMP stopping layer.

The method is thus equally a method for producing a semiconductor device comprising n IMD levels, said method comprising the above steps.

The method of the disclosure provides the advantage of a strongly improved process window for the CMP step after TSV plating. Besides this, problems related to drift of the dry etching in subsequent integration of the next metal layer (as illustrated in FIG. 1) are not encountered. An additional advantage is that no additional step has to be added to the process flow compared to the integration in the beginning of the TSV module, as the thin oxide layer that needs to be deposited in order to prevent footing of the resist for the contact photoresist is replaced by incorporating the CMP stopping layer 5 (e.g. SiC layer).

In a second aspect preferred embodiments provide a semiconductor substrate 1 and related device comprising:

A PMD stack 2 with a CMP stopping layer 5 on top of said PMD stack deposited on said substrate 1, and At least one Through Substrate Via (TSV) 4 which is etched through the CMP stopping layer, the PMD stack and partly in the substrate such that said TSV 4 is embedded in the CMP stopping layer and the PMD stack and partly in the substrate, and At least one contact via 3 which is etched through the CMP stopping layer 5 and the PMD stack 2 such that said contact via 3 is embedded in the CMP stopping layer and the PMD stack In other words, the disclosure is related to a semiconductor device (see FIG. 3A), comprising:

A semiconductor substrate 1, preferably a silicon substrate,

A PMD stack 2 with a CMP stopping layer 5 on top of said PMD stack deposited on said substrate 1, and At least one Through Substrate Via (TSV) 4 obtainable by etching through the CMP stopping layer 5, the PMD stack 2 and partly in the substrate such that said TSV 4 is embedded in the CMP stopping layer 5 and the PMD stack 2 and partly in the substrate, and At least one contact via 3 obtainable by etching through the CMP stopping layer 5 and the PMD stack 2 such that said contact via 3 is embedded in the CMP stopping layer 5 and the PMD stack 2.

In the device according to the FEOL embodiment, the TSV 4 and the contact via 3 are filled with at least a conductive material and their upper sides are at the same planar level. The above embodiment is hereafter referred to as the 'FEOL embodiment' of a device according to the disclosure.

FIG. 3A illustrates the final device according to the FEOL embodiment, having at least one Through Substrate Via 4 (TSV) fabricated according to the method of preferred embodiments of the disclosure wherein said TSV is created in the FEOL stage of the processing.

FIG. 3A illustrates a substrate 1 comprising a PMD stack 2 with at least one contact via 3 and a TSV 4 characterized in that the upper side of the at least one Through Substrate Via (TSV) and the at least one contact are both embedded in (surrounded by) a CMP stopping layer selected from silicon carbon (SiC), silicon nitride (SiN), silicon oxycarbide (SiOC), silicon oxynitride (SiON).

According to an alternative and also preferred embodiment of the second aspect of the disclosure, a semiconductor substrate 1 and related device is provided comprising:

An at least partly completed Back End Of Line (BEOL) stack comprising an n-1 metal level of vias and trenches 23 embedded in an Inter Metal dielectric (IMD) stack 22 with a CMP stopping layer 25 on top of said IMD stack deposited on said substrate 21, and At least one Through Substrate Via (TSV) 24 which is etched through the CMP stopping layer 25, the IMD stack and partly in the substrate 21 such that said TSV 24 is embedded in the CMP stopping layer 25 and the IMD stack 22 and partly in the substrate 21, and At least one n metal level via 26 which is etched through the CMP stopping layer 25 and the IMD stack 22 such that said n metal level via 26 is embedded in the CMP stopping layer and the IMD stack 22

In other words, the disclosure is related to a semiconductor device (see FIG. 3B), comprising:

An at least partly completed Back End Of Line (BEOL) stack comprising n-1 metal levels of vias and trenches 23 embedded in an Inter Metal dielectric (IMD) stack 22 with a CMP stopping layer 25 on top of said IMD stack deposited on said substrate 21, and At least one Through Substrate Via (TSV) 24 obtainable by etching through the CMP stopping layer 25, the IMD stack and partly in the substrate 21 such that said TSV 24 is embedded in the CMP stopping layer 25 and the IMD stack 22 and partly in the substrate 21, and An $n^{th}$ metal level via 26 obtainable by etching through the CMP stopping layer 25 and the IMD stack 22 such that said $n^{th}$ metal level via 26 is embedded in the CMP stopping layer and the IMD stack 22

In the device according to the BEOL embodiment, the TSV 24 and the $n^{th}$ metal level via 26 are filled with at least a conductive material and their upper sides are at the same planar level.

FIG. 3B illustrates the final device according to the BEOL embodiment of the disclosure having at least one Through Substrate Vias 4 (TSV) fabricated according to the method of preferred embodiments of the disclosure wherein said TSV is created in the BEOL stage of the processing.

FIG. 3B illustrates a substrate 21 comprising an $(n-1)^{th}$ metal level of vias and trenches 23 embedded in an Inter Metal dielectric (IMD) stack 22 with a CMP stopping layer 25 on top of said IMD stack and at least one $n^{th}$ metal level via 26 and TSV 24 characterized in that the upper side of the at least one Through Substrate Via (TSV) and the at least one $n^{th}$ metal level via 26 and TSV 24 are both embedded (surrounded) in a CMP stopping layer selected from silicon carbon (SiC), silicon nitride (SiN), silicon oxycarbide (SiOC), silicon oxynitride (SiON).

Particular and preferred aspects are set out in the accompanying independent and dependent claims. Features from the dependent claims may be combined with features of the independent claims and with features of other dependent claims as appropriate and not merely as explicitly set out in the claims. Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

What is claimed is:

1. A method for producing a semiconductor device, comprising:

providing a semiconductor substrate, the semiconductor comprising one or more active components on a surface of the semiconductor substrate;

depositing a top layer of dielectric material on the surface of the substrate or on a dielectric layer present on the surface of the semiconductor substrate;

depositing a common chemical mechanical polishing stopping layer on the top layer;

etching one or more first openings through at least the top layer, filling the one or more first openings with a first conductive material, and performing a first chemical mechanical polishing to form first conductive structures, wherein the common chemical mechanical polishing stopping layer stops the first chemical mechanical polishing;

etching one or more second openings through at least the top layer, filling the one or more second openings with a second conductive material, and performing a second chemical mechanical polishing to form second conductive structures, wherein the common chemical mechanical polishing stopping layer stops the second chemical mechanical polishing.

2. The method of claim 1, wherein the top layer is a pre-metal dielectric stack deposited on the surface of the semiconductor substrate and wherein the one or more first openings filled with a first conductive material are contact vias for contacting the active components on a surface of the semiconductor substrate and the one or more second openings filled with a second conductive material are through substrate vias for connecting a sub-laying integrated circuit.

3. The method of claim 1, wherein the top layer is an intermetal dielectric layer deposited on a pre-metal dielectric stack or another intermetal dielectric layer on the surface of the semiconductor substrate, wherein the one or more first openings filled with a first conductive material are contact vias for contacting the active components on a surface of the semiconductor substrate and the one or more second openings filled with a second conductive material are through substrate vias for connecting a sub-laying integrated circuit.

4. The method of claim 2, further comprising:
providing the semiconductor substrate, wherein the semiconductor substrate further comprises a pre-metal dielectric stack; thereafter
depositing the chemical mechanical polishing stopping layer; thereafter
depositing photosensitive layers and patterning openings in the photosensitive layers to define contact vias in the pre-metal dielectric stack; thereafter
etching the contact vias in the pre-metal dielectric stack and then stripping remaining photosensitive material; thereafter
depositing a dielectric material and a barrier material onto sidewalls of the contact vias and then filling the contact vias with a first conductive material; thereafter
removing an overburden of barrier material and first conductive material using chemical mechanical polishing to the chemical mechanical polishing stopping layer; thereafter
depositing photosensitive layers and patterning openings in the photosensitive layers to define through substrate vias; thereafter
etching the through substrate vias in the pre-metal dielectric stack and in a part of the semiconductor substrate and then stripping remaining photosensitive material; thereafter
depositing a dielectric material and a barrier material onto the sidewalls of the through substrate vias and then filling the through substrate vias with a second conductive material; and thereafter
removing the overburden of barrier material and second conductive material using chemical mechanical polishing.

5. The method of claim 4, wherein depositing a dielectric material and a barrier material onto sidewalls of the through substrate vias further comprises depositing a seed material onto sidewalls of the through substrate vias; and wherein removing the overburden further comprises removing an overburden of seed material.

6. The method of claim 3, comprising:
providing the semiconductor substrate, wherein the semiconductor substrate comprises an at least partly completed back end of line stack comprising n-1 levels of vias and trenches embedded in an intermetal dielectric layer; thereafter
depositing another intermetal dielectric layer to form level n of the back end of line stack;
depositing the chemical mechanical polishing stopping layer on top of the intermetal dielectric layer forming level n of the back end of line stack; thereafter
depositing photosensitive layers on top of the chemical mechanical polishing stopping layer and patterning openings in the photosensitive layers to define trenches and/or vias within the intermetal dielectric layer forming level n of the back end of line stack; thereafter
etching the trenches and/or vias within the patterned openings in the deposited intermetal dielectric layer forming level n of the back end of line stack and then stripping remaining photosensitive material; thereafter
depositing at least one material selected from the group consisting of a dielectric material, a barrier material, and a seed material onto sidewalls of the trenches and/or vias; thereafter
filling the trenches and/or vias with a first conductive material; thereafter
removing an overburden of deposited material and first conductive material using chemical mechanical polishing; thereafter
depositing photosensitive layers and patterning openings in the photosensitive layers to define through substrate vias; thereafter
etching through substrate vias in the intermetal dielectric layer forming level n of the back end of line stack, wherein the through substrate vias further extend into the substrate, and then stripping remaining photosensitive material; thereafter
depositing a dielectric material and a barrier material onto sidewalls of the through substrate vias and subsequently filling the through substrate vias with a second conductive material; and thereafter
removing an overburden of dielectric material, barrier material, and second conductive material using chemical mechanical polishing.

7. The method of claim 6, wherein depositing a dielectric material and a barrier material onto sidewalls of the through substrate vias further comprises depositing a seed material onto sidewalls of the through substrate vias; and wherein removing the overburden further comprises removing an overburden of seed material.

8. The method of claim 1, wherein the chemical mechanical polishing stopping layer is selected from the group consisting of a silicon carbon layer, a silicon nitride layer, a silicon oxycarbide layer, and a silicon oxynitride layer, and wherein the chemical mechanical polishing stopping layer is deposited using chemical vapor deposition.

9. The method of claim 1, wherein the substrate is a silicon substrate.

* * * * *